US 6,682,876 B2

United States Patent
Ahn et al.

(10) Patent No.: US 6,682,876 B2
(45) Date of Patent: Jan. 27, 2004

(54) THINNER COMPOSITION AND METHOD OF STRIPPING A PHOTORESIST USING THE SAME

(75) Inventors: Seung-Hyun Ahn, Suwon-Si (KR); Sang-Mun Chon, Yongin-Si (KR); Hoe-Sik Chung, Gyeonggi-Do (KR); Mi-Sook Jeon, Seoul (KR); Eun-Mi Bae, Yongin-Si (KR); Baik-Soon Choi, Anyang-Si (KR); Ok-Seok Jang, Gyeonggi-Do (KR); Young-Cheul Lim, Gyeonggi-Do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/378,615

(22) Filed: Mar. 5, 2003

(65) Prior Publication Data

US 2003/0157441 A1 Aug. 21, 2003

Related U.S. Application Data

(63) Continuation-in-part of application No. 10/116,030, filed on Apr. 5, 2002, now Pat. No. 6,589,719.

(30) Foreign Application Priority Data

| Dec. 14, 2001 | (KR) | 2001-79490 |
| Mar. 13, 2002 | (KR) | 2002-13631 |
| Oct. 15, 2002 | (KR) | 10-2002-0062652 |

(51) Int. Cl.[7] .................................................. G03F 7/42
(52) U.S. Cl. ...................... 430/329; 430/327; 430/331; 510/176
(58) Field of Search .............................. 430/327, 329, 430/331; 510/176

(56) References Cited

U.S. PATENT DOCUMENTS

| 4,983,490 | A | * | 1/1991 | Durham | 430/169 |
| 5,370,817 | A | * | 12/1994 | Weltman et al. | 510/175 |
| 5,413,729 | A | | 5/1995 | Gaul | 510/176 |
| 5,866,305 | A | | 2/1999 | Chon et al. | 430/331 |
| 5,964,951 | A | * | 10/1999 | Yamamoto et al. | 430/319 |
| 6,117,623 | A | | 9/2000 | Koshiyama et al. | |
| 6,159,646 | A | | 12/2000 | Jeon et al. | 430/331 |
| 6,169,646 | B1 | | 1/2001 | Macken et al. | 510/201 |
| 6,183,942 | B1 | | 2/2001 | Kim et al. | |
| 6,458,518 | B1 | | 10/2002 | Moon et al. | 430/331 |
| 2003/0091942 | A1 | * | 5/2003 | Park et al. | 430/327 |

FOREIGN PATENT DOCUMENTS

| JP | 8-104895 | 4/1995 |
| KR | 2001-0036461 | 5/2001 |

* cited by examiner

Primary Examiner—Richard L. Schilling
(74) Attorney, Agent, or Firm—Volentine Francos, PLLC

(57) ABSTRACT

A thinner composition is effective in removing a variety of photoresists, and includes propylene glycol mono-methyl ether acetate, ethyl 3-ethoxy propionate and at least one of γ-butyro lactone and propylene glycol mono-methyl ether. The thinner composition can selectively strip a photoresist coated on a backside and at an edge portion of a substrate, as well as a photoresist coated on a whole front surface of the substrate.

21 Claims, 2 Drawing Sheets

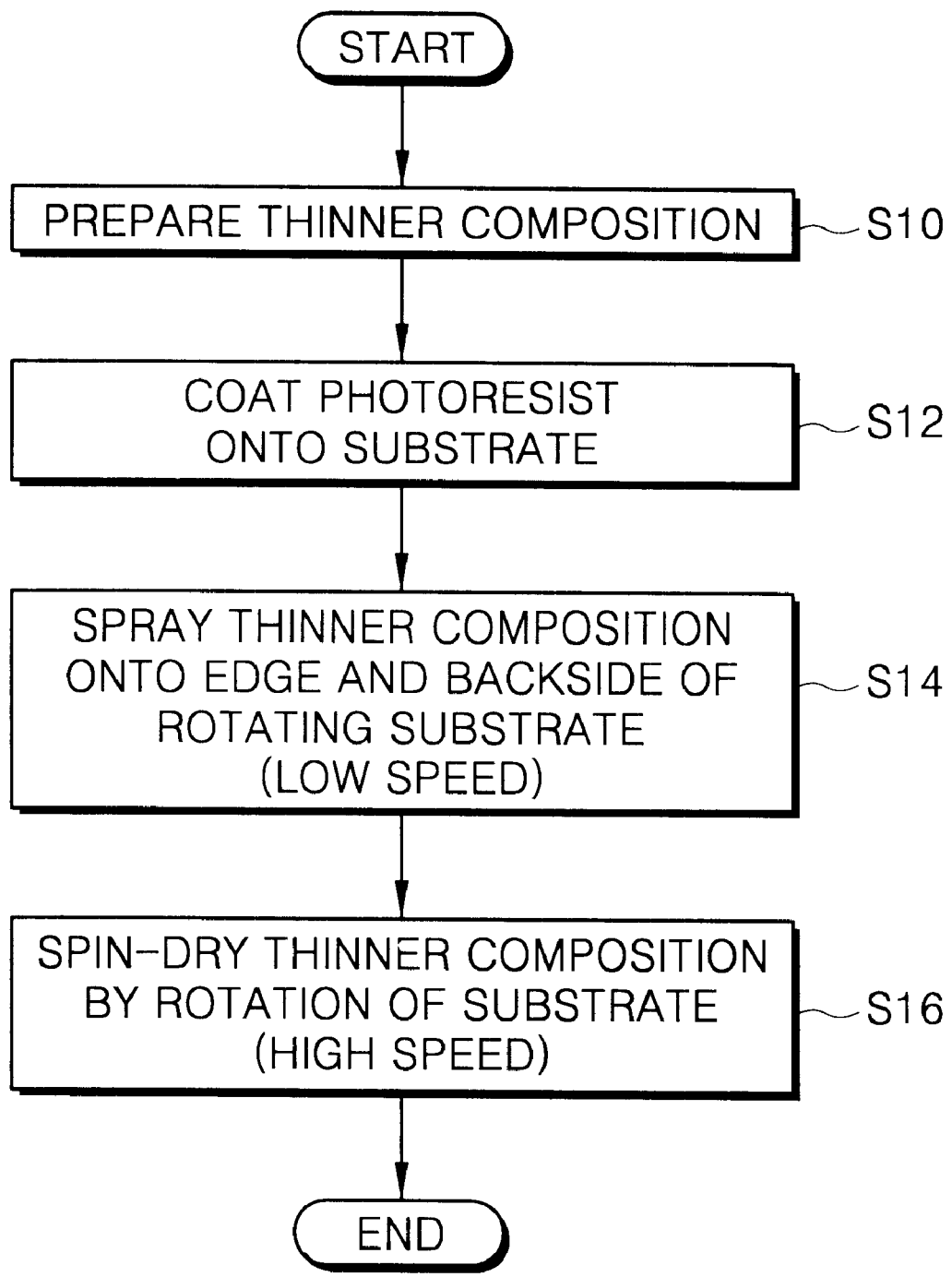

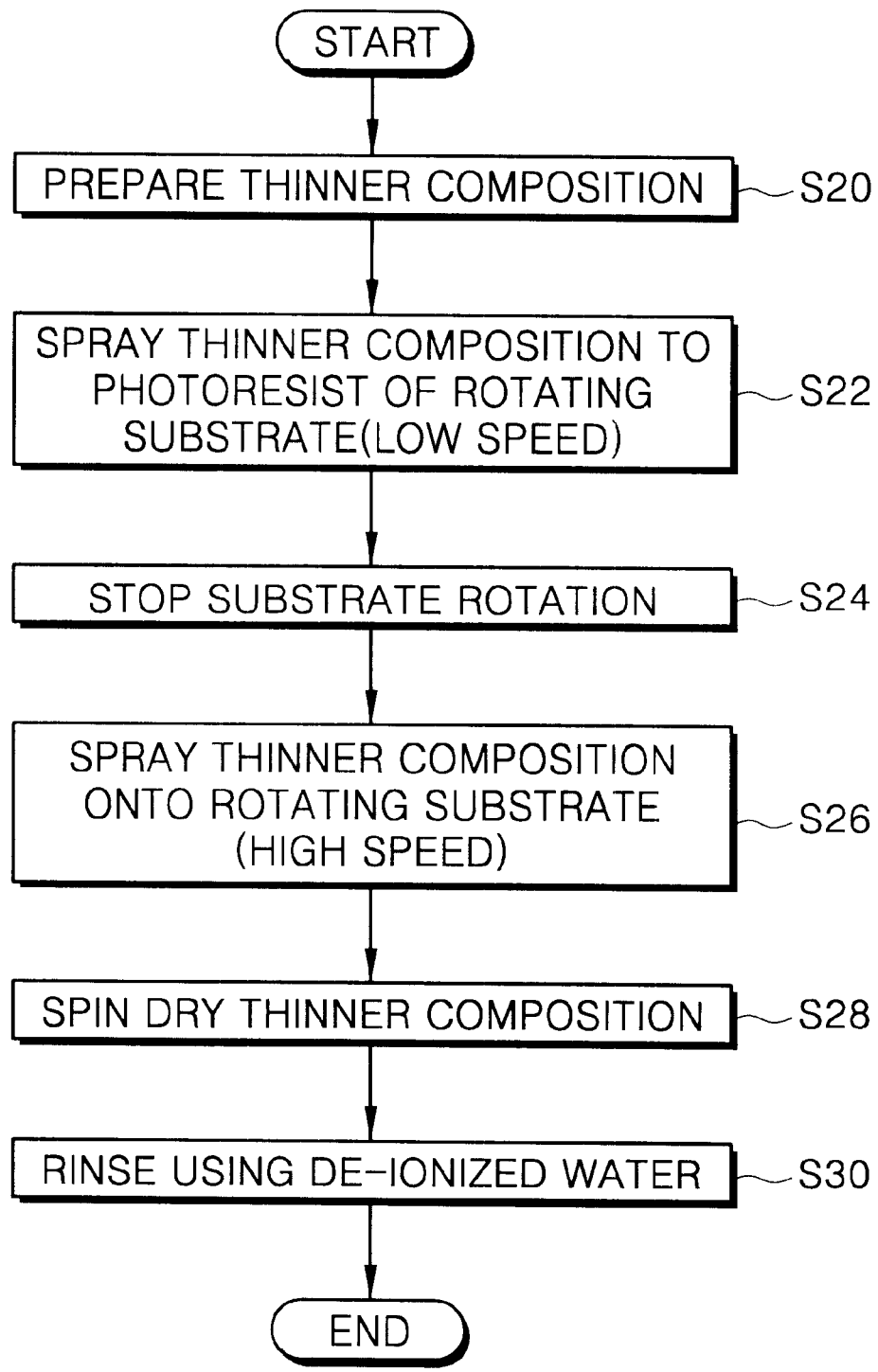

THINNER COMPOSITION AND METHOD OF STRIPPING A PHOTORESIST USING THE SAME

CROSS-REFERENCE TO RELATED APPLICATIONS

This is a continuation-in-part of and claims priority to U.S. patent applications Ser. No. 10/116,030, now U.S. Pat. No. 6,589,719 filed on Apr. 5, 2002, the contents of which are herein incorporated by reference in their entirety. A claim of priority is also made to Korean Patent Application No. 2002-62652 filed on Oct. 15, 2002, Korean Patent Application No. 2002-13631, filed Mar. 13, 2002, and Korean Patent Application No. 2001-79490, filed Dec. 14, 2001, the contents of each of which are herein incorporated by reference in their entirety.

BACKGROUND OF THE INVENTION

1. Field of the Invention

The present invention relates to a thinner composition and to a method of stripping a photoresist using the same.

2. Description of the Related Art

In order to fabricate semiconductor devices, it is necessary to accurately inject impurities into specific minute regions of a silicon substrate. These minute regions are typically inter-connected to form devices in very large scale integrated (VLSI) circuits. Patterns which define the minute regions are formed by photolithography processes. Generally, in photolithography, a photoresist polymer film is coated on a substrate, and then, the polymer film is selectively developed by exposure to ultraviolet rays, electronic rays or X-rays. The developed portions of the photoresist are removed, and the remaining non-developed photoresist polymer film pattern functions to mask selected areas of the underlying substrate during subsequent processes.

Rework and edge bead removal (EBR) processes are common processes encountered during photolithography of semiconductor wafers or substrates.

Occasionally, the photolithography process suffers a process failure in which the photoresist is not properly coated or patterned on the substrate. When a process failure occurs, the rework process is carried out where the photoresist film coated on the substrate is completely removed using a stripping composition, and then, the substrate is re-used.

On the other hand, EBR results from certain characteristics of the photoresist coating process. That is, the photoresist is coated onto a wafer by dispensing the photoresist material onto a surface of the wafer while the wafer is rotating. As a result, the photoresist material tends to accumulate at the edge of the wafer, forming a so-called edge bead. Also, during the spraying process, photoresist material inevitably becomes coated onto the backside of the wafer. Accordingly, in the EBR process, a stripper composition is used to remove any unwanted photoresist from the edge and backside of the wafer.

During both the rework and EBR process, it is important that the photoresist not dissolve too slowly or incompletely in the stripper composition, otherwise residual contaminants (photoresist) may remain on the substrate after the stripping process. Any such contaminants can reduce device yield and adversely impact product reliability.

In the meantime, to accommodate for increased degrees of integration of semiconductor devices, new photoresist are being developed. For example, a photoresist having novolak resin as a main component has been developed for application with light of I-line or G-line wavelengths. Also, amplified type photoresists which respond to an excimer laser or deep ultraviolet (DUV) also have been employed.

Examples of the thinner compositions that can be used to dissolve various kind of photoresist are disclosed in commonly assigned U.S. Pat. No. 5,866,305 (issued to Chon et. al.), commonly assigned U.S. Pat. No. 6,159,646 (issued to Jeon et. al.), and commonly assigned U.S. Pat. No. 6,458,518 (issued to Sang-sik Moon et al.)

In the U.S. Pat. No. 5,866,305, thinner compositions are disclosed which include ethyl lactate and ethyl-3-ethoxy propionate, or ethyl lactate, ethyl-3-ethoxy propionate and gamma-butyro lactone. These thinner compositions are commonly used in semiconductor device fabrication, but are very expensive due to the high price of ethyl 3-ethoxy propionate. Further, the thinner compositions cannot sufficiently dissolve certain types of photoresists, for example, amplified type photoresists. Likewise, in the U.S. Pat. No. 6,159,646, a thinner composition including ethyl-3-ethoxy propionate, ethyl lactate and gamma-butyro lactone is disclosed. Again, however, the use of ethyl 3-ethoxy propionate results in high costs.

The U.S. Pat. No. 6,458,518 discloses a thinner composition for stripping a photoresist which includes acetone, gamma-butyro lactone and an ester compound. The acetone exhibits a strong penetration characteristic which results in a poor edge profile characteristic of the thinner composition, which is clearly evident when the thinner composition is used to dissolve a deep ultraviolet (DUV) resist layer. In addition, the acetone is so volatile that when the thinner composition used, photoresist residues often remain, especially when the EBR process is carried out using a thinner composition made up of N-Butyl Acetate (hereinafter, referred to as NBA), gamma-butyro lactone (GBL), and acetone.

The above-described thinner compositions are commonly used in both the rework process and the EBR process, but do not strip the photoresist layer to the same extent in both of the processes. Accordingly, there is a demand for photoresist stripper compositions which exhibit favorable stripping characteristics in both the rework and EBR processes, and with respect to different types of photoresists, yet which can be manufactured at relatively low cost.

SUMMARY OF THE INVENTION

According to a first aspect of the present invention, there is provided a thinner composition for stripping a photoresist, where the thinner composition includes propylene glycol mono-methyl ether acetate (PGMEA), ethyl 3-ethoxy propionate (EEP), and γ-butyro lactone (GBL).

According to another aspect of the present invention, there is provided a thinner composition for stripping a photoresist, where the thinner composition includes propylene glycol mono-methyl ether acetate (PGMEA), ethyl 3-ethoxy propionate (EEP), and propylene glycol mono-methyl ether (PGME).

According to yet another aspect of the present invention, there is provided a method of stripping a photoresist layer, where the method includes providing a thinner composition which includes propylene glycol mono-methyl ether acetate (PGMEA), ethyl 3-ethoxy propionate (EEP), and at least one of γ-butyrolactone (GBL) and propylene glycol mono-methyl ether (PGME), stripping a photoresist layer coated on at least one of a backside and an edge portion of a substrate by bringing the thinner composition into contact with the photoresist layer, and drying the thinner composition that is brought into contact on the photoresist layer.

According to still another aspect of the present invention, there is provided a method of stripping a photoresist layer, where the method includes providing a thinner composition which includes propylene glycol mono-methyl ether acetate (PGMEA), ethyl 3-ethoxy propionate (EEP), and at least one of γ-butyrolactone (GBL) and propylene glycol mono-methyl ether (PGME), spraying the thinner composition onto a substrate coated with a photoresist layer while the substrate is rotated at a first speed, and drying the thinner composition that is brought into contact on the substrate.

According to the present invention, a relatively inexpensive compound, i.e., propylene glycol mono-methyl ether acetate (PGMEA), is used as a major component of the thinner compositions. However, while costs are substantially reduced in this manner, the thinner compositions exhibit very favorable photoresist stripping characteristics. Also advantageous is the eco-friendly nature of the compounds of the thinner compositions of the present invention.

BRIEF DESCRIPTION OF THE DRAWINGS

The above and other objects and advantages of the present invention will become readily apparent from the detailed description that follows, with reference to the accompanying drawings, in which:

FIG. 1 is a flow chart for describing a method of stripping a photoresist layer coated on an edge portion and a backside of a substrate using a thinner composition according to an embodiment of the present invention; and FIG. 2 is a flow chart for describing a method of stripping a photoresist layer coated on a front surface of a substrate using a thinner composition according to an embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the characteristic features of the invention to those skilled in the art.

The thinner composition of a first embodiment of the present invention includes propylene glycol mono-methyl ether acetate (hereinafter, referred to as PGMEA), ethyl 3-ethoxy propionate (hereinafter, referred to as EEP) and γ-butyro lactone (hereinafter, referred to as GBL).

When an amount of the PGMEA exceeds 80% by weight based on the total weight of the thinner composition, the photoresist stripping characteristic of the thinner composition deteriorates. When the amount of the PGMEA is less than 50% by weight based on the total weight of the thinner composition, a relative amount of the EEP is increased so that the solubility of photoresist in the thinner composition is reduced and the EBR characteristic of the thinner composition deteriorates. Therefore, the amount of the PGMEA is preferably in a range of about 50% to about 80% by weight based on the total weight of the thinner composition, and more preferably, is in a range of about 53% to about 75% by weight based on the total weight of the thinner composition.

The physical characteristics of PGMEA are as follows: a specific gravity of 0.968 at 20° C.; a viscosity of 1.3 cps at 25° C.; a boiling point at an atmospheric pressure of 145° C. to 146° C.; and a flash point at an atmospheric pressure of 43° C. The PGMEA has advantages in that the price thereof is relatively low and the wettability thereof (i.e., degree of spread on the substrate or degree of reaction with the photoresist layer) is relatively good. However, indentations are created on the photoresist layer coated at the edge portion of the substrate during the EBR process when the PGMEA is used alone.

When an amount of the EEP is less than 10% by weight based on the total weight of the thinner composition, the EBR characteristic of the thinner composition deteriorates, and when the amount of the EEP is more than 50% by weight based on the total weight of the thinner composition, solubility of a specific photoresist layer in the thinner composition is reduced. Therefore, the amount of the EEP is preferably in a range of about 10% to about 45% by weight based on the total weight of the thinner composition, and more preferably, is in a range of about 12% to about 30% by weight based on the total weight of the thinner composition.

The GBL is known for its ability to dissolve resins. When an amount of the GBL is less than 1% by weight based on the total weight of the thinner composition, solubility of a photoresist in the thinner composition is reduced, and the EBR characteristic of the thinner composition deteriorates. When the amount of the GBL exceeds 12% by weight based on the total weight of the thinner composition, the manufacturing cost of the thinner composition is considered too high. Therefore, the amount of the GBL is preferably in a range of about 1% to about 12% by weight based on the total weight of the thinner composition, and more preferably, is in a range of about 2% to about 10% by weight based on the total weight of the thinner composition.

In addition, the thinner composition of the first embodiment can further include a trace amount of surfactant, as occasion dictates. Examples of the surfactant applicable to the thinner composition according to first embodiment of the present invention include alkyl benzene sulfonate and an alkaline metal salt thereof, alkylated diphenyl disulfonate and an alkaline metal salt thereof, alkyl aryl sulfonate, alkaline metal salt of fluoroalkyl carboxylate, ammonium perfluoro alkyl sulfonate, etc. The surfactant improves the wettability of the thinner composition, and helps each component of the thinner composition be well mixed with one another. Preferably, an amount of the surfactant is no more than 1% by weight based on the total weight of the thinner composition.

A thinner composition according to a second embodiment of the present invention includes PGMEA, propylene glycol mono-methyl ether (hereinafter, referred to as PGME), and EEP.

Like the first embodiment, the thinner composition of the second embodiment also includes PGMEA as a major component, and characteristics of PGMEA are described above.

When an amount of the PGMEA is no less than 80% by weight based on the total weight of the thinner composition, the stripping characteristic of the thinner composition is deteriorated, and when the amount of the PGMEA is less than 40% by weight based on the total weight of the thinner composition, the manufacturing cost of the thinner composition is increased. Therefore, the amount of the PGMEA is preferably in a range of about 40% to about 80% by weight based on the total weight of the thinner composition, and more preferably, is in a range of about 40% to about 70% by weight based on the total weight of the thinner composition.

When an amount of the EEP is less than 5% by weight based on the total weight of the thinner composition, the stripping characteristic of the thinner composition deteriorates. When the amount of the EEP exceeds 45% by weight based on the total weight of the thinner composition, solubility of a photoresist in the thinner composition is reduced. Therefore, the amount of the EEP is preferably in a range of about 5% to about 45% by weight based on the total weight of the thinner composition, and more preferably, is in a range of about 10% to about 40% by weight based on the total weight of the thinner composition. Most preferably, the amount of the EEP is in a range of about 20% to about 30% by weight based on the total weight of the thinner composition.

When an amount of the PGME is less than 5% by weight or exceeds 35% by weight based on the total weight of the thinner composition, the EBR characteristic of the thinner composition deteriorates. Therefore, the amount of the PGME is preferably in a range of about 5% to about 35% by weight based on the total weight of the thinner composition, and more preferably, is in a range of about 10% to about 30% by weight based on the total weight of the thinner composition. Most preferably, the amount of the EEP is in a range of about 15% to about 25% by weight based on the total weight of the thinner composition.

As with the first embodiment, the second thinner composition of the second embodiment can also include a small amount of the surfactants mentioned above in connection with the first embodiment. Preferably, an amount of the surfactant in the thinner composition of the second embodiment is no more than 1% by weight based on the total weight of the thinner composition.

EBR Process

FIG. 1 is a flow chart for describing a method of stripping a photoresist layer coated on an edge portion and a backside of a substrate using a thinner composition according to the present invention.

Referring to FIG. 1, a thinner composition including PGMEA, GBL and EEP or including PGMEA, PGME and EEP is prepared (step S10).

Next, a photoresist is coated onto a substrate (step S12). The photoresist is usually coated using a spin-coater. Namely, the photoresist is coated on the substrate rotated by the spin-coater. Accordingly, the photoresist supplied on the substrate is dispersed to an edge portion of the substrate by centrifugal forces exerted thereon so that the photoresist is uniformly coated over the whole surface.

The centrifugal forces cause the photoresist to disperse onto a backside of the substrate as well as at the edge portion of the substrate, and the photoresist on the backside and at the edge portion of the substrate creates failures in the subsequent processes.

Therefore, in order to strip the photoresist on the backside and at the edge portion of the substrate, the thinner composition according to a preferred embodiment of the present invention is brought into contact with the backside and the edge portion of the substrate (step S14). As one embodiment, the contact of the thinner composition and the substrate is carried out through spraying the thinner composition onto the substrate. For example, in the embodiment of the method described here, the thinner composition is sprayed through nozzle on the substrate rotated by the spin-chuck.

When spraying the thinner composition, it is preferable that the substrate is rotated sequentially at a low speed and then a high speed using the spin-chuck. That is, the thinner composition is sprayed on the backside and at the edge portion of the substrate while the substrate is first rotated at a relatively low speed. For example, the substrate is rotated at a speed of about 800 rpm to 1200 rpm and the thinner composition is sprayed through the nozzle for about five seconds to ten seconds, and more preferably for about six seconds. The thinner composition sprayed on the rotating substrate is also dispersed at the edge portion and on the backside of the substrate by the centrifugal forces, and the photoresist coated at the edge portion and on the backside of the substrate is stripped away.

Next, the substrate is rotated at a relatively high speed of about 2000 rpm to 2500 rpm to thereby spin-dry the substrate (step S16). The spin-dry process can be omitted if necessary.

The thinner composition can be sprayed in several ways. For example, the thinner composition can be sprayed at the edge portion of the rotating substrate through the fixed nozzle. The thinner composition can also be sprayed on the fixed substrate through the nozzle moving along the edge portion of the substrate. The thinner composition can be sprayed on the backside of the substrate in a similar way that the thinner composition is sprayed at the edge portion of the substrate as described in the above. Then, the substrate is to be subjected to a conventional photolithography process, that is, to sequential processes of a baking process, an exposure process and a development process.

Rework Process

FIG. 2 is a flow chart for describing a method of stripping a photoresist layer coated on a front surface of a substrate using a thinner composition according to an embodiment of the present invention.

The rework process is performed to recover from process failures when the photolithography process is completed, that is, when the developing process is completed.

Referring to FIG. 2, a thinner composition according to an embodiment of the present invention is prepared to include PGMEA, GBL and EEP, or to include PGMEA, PGME and EEP (step S20).

The thinner composition is brought into contact with a substrate which is to be reworked and then reused, and which includes a photoresist layer to be removed. The contact of the thinner composition with the substrate is performed by dipping the substrate into a bath including the thinner composition, or as in this embodiment, by spraying the thinner composition onto the substrate using a spin chuck and a nozzle.

The thinner composition is sprayed on the substrate while the substrate is rotated at a relatively low speed (Step S22). For example, the substrate is rotated at a speed of about 800 rpm to 2000 rpm, and the thinner composition is sprayed through the nozzle for about 10 seconds to 20 seconds. The thinner composition sprayed on the rotating substrate is then uniformly dispersed over the whole surface of substrate by the centrifugal forces.

Then, the rotation of the substrate is stopped for about 10–30 seconds (Step S24). As a result, the thinner composition dissolves the photoresist coated on the substrate.

Subsequently, although not shown in FIG. 2, the substrate can be rotated at a relatively high speed of about 200 rpm to 2500 rpm to thereby spin-dry the substrate. The spin-dry process can be omitted if necessary.

Then, to remove photoresist residues remaining on the substrate, the thinner composition is sprayed for about 10 seconds to about 20 seconds while the substrate is rotated at a speed of 2000 rpm to 2500 rpm (step S26). The photoresist residues are thus removed from the substrate.

Next, the supply of the thinner composition is stopped, and therefore, the substrate continues to rotate at the speed of about 2000–2500 rpm in the absence of the spraying of thinner composition. Accordingly, the thinner composition sprayed on the substrate is spin-dried (step S28).

Subsequently, while the rotation of the substrate continues, de-ionized water is sprayed over the whole surface of the substrate to thereby rinse the surface of the substrate (step S30).

The steps S24, S26 and S30 are considered optional, and can be omitted if necessary.

A defective photoresist layer coated on a substrate can be stripped away as described above, and the substrate can then be re-used.

As described above, the thinner compositions according to the preferred embodiments of the present invention can be made at relatively low cost, yet can strip off a variety of photoresists from substrates with good efficiency.

EXAMPLE AND COMPARATIVE EXAMPLES

A number (5) of non-limiting examples of the present invention are described below, followed by a number (10) of comparative examples.

Example 1

PGMEA, GBL and EEP were placed in a vessel and mixed to thereby prepare a thinner composition. The thinner composition was adjusted to include about 73% by weight of the PGMEA, 2% by weight of the GBL, and 25% by weight of the EEP. The viscosity of the thus prepared thinner composition was 1.3 cp (measured in a thermostat at a temperature of about 25° C.).

Example 2

PGMEA, GBL and EEP were placed in a vessel and mixed to thereby prepare a thinner composition. The thinner composition was adjusted to include 54% by weight of the PGMEA, 10% by weight of the GBL, and 36% by weight of the EEP. The viscosity of the thus prepared thinner composition was 1.3 cp (measured in a thermostat at a temperature of about 25° C.).

Example 3

PGMEA, PGME and EEP were placed in a vessel and mixed to thereby prepare a thinner composition. The thinner composition was adjusted to include 60% by weight of the PGMEA, 30% by weight of the PGME and 10% by weight of the EEP. The viscosity of the thus prepared thinner composition was 1.4 cp (measured in a thermostat at a temperature of about 25° C.).

Example 4

PGMEA, PGME and EEP were place in a vessel and mixed to thereby prepare a thinner composition. The thinner composition was adjusted to include 50% by weight of the PGMEA, 20% by weight of the PGME, and 30% by weight of the EEP. The viscosity of the thus prepared thinner composition was 1.4 cp (measured in a thermostat at a temperature of about 25° C.).

Example 5

PGMEA, PGME and EEP were placed in a vessel and mixed to thereby prepare a thinner composition. The thinner composition was adjusted to include 50% by weight of the PGMEA, 10% by weight of the PGME, and 40% by weight of the EEP. The viscosity of the thus prepared thinner composition was 1.4 cp (measured in a thermostat at a temperature of about 25° C.).

Comparative Example 1

A thinner was prepared to include only the PGMEA. The viscosity of the thus prepared thinner composition was 1.3 cp (measured in a thermostat at a temperature of about 25° C.).

Comparative Example 2

PGMEA and GBL were placed in a vessel and mixed to thereby prepare a thinner composition. The thinner composition was adjusted to include 95% by weight of PGMEA and 5% by weight of GBL. The viscosity of the thus prepared thinner composition was 1.3 cp (measured in a thermostat at a temperature of about 25° C.).

Comparative Example 3

PGMEA and EEP were placed in a vessel and mixed to thereby prepare a thinner composition. A ratio of the PGMEA to the EEP in the thinner composition was adjusted to be 80:20. The viscosity of the thus prepared thinner composition was 1.2 cp to 1.3 cp (measured in a thermostat at a temperature of about 25° C.).

Comparative Example 4

PGMEA and PGME were placed in a vessel and mixed to thereby prepare a thinner composition. A ratio of the PGMEA to the PGME in the thinner composition was adjusted to be 80:20. The viscosity of the thus prepared thinner composition was 1.2 cp to 1.3 cp (measured in a thermostat at a temperature of about 25° C.).

Comparative Example 5

PGMEA and ethyllactate (hereinafter, referred to as EL) were placed in a vessel and mixed to thereby prepare a thinner composition. A ratio of the PGMEA to the EL in the thinner composition was adjusted to be 80:20. The viscosity of the thus prepared thinner composition was 1.4 cp (measured in a thermostat at a temperature of about 25° C.).

Comparative Example 6

PGMEA, GBL and EEP were placed in a vessel and mixed to thereby prepare a thinner composition. The thinner composition was adjusted to include 38% by weight of the PGMEA, 2% by weight of the GBL, and 60% by weight of the EEP. The viscosity of the thus prepared thinner composition was 1.2 cp to 1.3 cp (measured in a thermostat at a temperature of about 25° C.).

Comparative Example 7

EEP, EL and GBL were placed in a vessel and mixed to thereby prepare a thinner composition. The thinner composition was adjusted to include 75% by weight of the EEP, 20% by weight of the EL, and 5% by weight of the GBL. The viscosity of the thus prepared thinner composition was 1.30 cp (measured in a thermostat at a temperature of about 25° C.).

Comparative Example 8

NBA and GBL were placed in a vessel and mixed to thereby prepare a thinner composition. A ratio of the NBA to the GBL in the thinner composition was adjusted to be 85:5. The viscosity of the thus prepared thinner composition was 0.74 cp (measured in a thermostat at a temperature of about 25° C.).

Comparative Example 9

A thinner was prepared to include only EEP. The viscosity of the thus prepared thinner composition was 1.2 cp (measured in a thermostat at a temperature of about 25° C.).

Comparative Example 10

A thinner was prepared to include only PGME. The viscosity of the thus prepared thinner composition was 1.75 cp (measured in a thermostat at a temperature of about 25° C.).

Dissolving Rate Experiments—Examples 1 and 4

A plurality of experiments wer carried out for measuring a dissolving rate of the thinner compositions prepared according to Examples 1 and 4 relative to various kinds of photoresists which are now in the manufacture of semiconductor devices.

Experiment 1

5 cc of GS111 M (trade name, a g-line photoresist manufactured by Shipley Korea company, Korea) was spin-coated onto a substrate and then a soft baking was performed to a temperature of 90° C. The photoresist layer was coated on the substrate to a thickness of about 12,200 Å.

Then, the substrate was dipped into thinner compositions according to Examples 1 and 4 to strip off the photoresist layer from the substrate, and dissolving rates of the thinner compositions were observed. The observed dissolving rates of the thinner compositions were approximately 12,000 Å/sec.

Experiment 2

5 cc of MCPR-4100H (trade name, an I-line photoresist manufactured by Shipley Korea company, Korea) was spin-coated onto a substrate and then a soft baking was performed to a temperature of 90° C. The photoresist layer was coated on the substrate to a thickness of about 11,900 Å.

Then, the substrate was dipped into thinner compositions according to Examples 1 and 4 to strip off the photoresist layer from the substrate, and dissolving rates of the thinner compositions were observed. The observed dissolving rates of the thinner composition were approximately 3,000 Å/sec.

Experiment 3

5 cc of SAT-701H (trade name, an I-line photoresist manufactured by TOK company, Japan) was spin-coated onto a substrate and then a soft baking was performed to a temperature of 90° C. The photoresist layer was coated on the substrate to a thickness of about 9,700 Å.

Then, the substrate was dipped into thinner compositions according to Examples 1 and 4 to strip off the photoresist layer from the substrate, and dissolving rates of the thinner compositions were observed. The observed dissolving rates of the thinner composition were approximately 9,700 Å/sec.

Experiment 4

5 cc of SAT-668 (trade name, an I-line photoresist manufactured by TOK company, Japan) was spin-coated onto a substrate and then a soft baking was performed to a temperature of 90° C. The photoresist layer was coated on the substrate to a thickness of about 19,700 Å.

Then, the substrate was dipped into thinner compositions according to Examples 1 and 4 to strip off the photoresist layer from the substrate, and dissolving rates of the thinner composition were observed. The observed dissolving rates of the thinner compositions were approximately 19,000 Å/sec.

Experiment 5

5 cc of PFI-58A (trade name, an I-line photoresist made by Dongwoo company, Korea) was spin-coated onto a substrate and then a soft baking was performed to a temperature of 110° C. The photoresist layer was coated on the substrate to a thickness of about 12,300 Å.

Then, the substrate was dipped into thinner compositions according to Examples 1 and 4 to strip off the photoresist layer from the substrate, and dissolving rates of the thinner composition were observed. The observed dissolving rates of the thinner compositions were approximately 12,200 Å/sec.

Experiment 6

5 cc of THMR-ip3100 (trade name, an I-line photoresist made by TOK company, Japan) was spin-coated onto a substrate and then a soft baking was performed to a temperature of 110° C. The photoresist layer was coated on the substrate to a thickness of about 14,400 Å.

Then, the substrate was dipped into thinner compositions according to Examples 1 and 4 to strip off the photoresist layer from the substrate, and dissolving rates of the thinner compositions were observed. The observed dissolving rates of the thinner compositions were approximately 14,400 Å/sec.

Experiment 7

5 cc of SEPR-402 (trade name, a DUV photoresist made by Shinetsu company, Japan) was spin-coated onto a substrate and then a soft baking was performed to a temperature of 110° C. The photoresist layer was coated on the substrate to a thickness of about 10,300 Å.

Then, the substrate was dipped into thinner compositions according to Examples 1 and 4 to strip off the photoresist layer from the substrate, and dissolving rates of the thinner compositions were observed. The observed dissolving rates of the thinner compositions were approximately 7,000 Å/sec.

Experiment 8

5 cc of SEPR-402 (trade name, a DUV photoresist made by Shinetsu company, Japan) was spin-coated onto a substrate and then a soft baking was performed to a temperature of 100° C. The photoresist layer was coated on the substrate to a thickness of about 5,700 Å.

Then, the substrate was dipped into thinner compositions according to Examples 1 and 4 to strip off the photoresist layer from the substrate, and dissolving rates of the thinner compositions were observed. The observed dissolving rates of the thinner compositions were approximately 5,700 Å/sec.

Experiments 1 to 8 indicate that the thinner compositions according to the Examples 1 and 4 exhibit good dissolving rates relative to most of photoresists that are presently used.

In addition, it was confirmed that the thinner compositions prepared according to the other examples (Examples 2, 3 and 5) of the present invention also exhibit good dissolving rates relative to most of the photoresists that are presently used. The thinner compositions of the present invention can be advantageously used to dissolve a variety of photoresists coated on a substrate.

Solubility Experiments—Examples 1 to 5 & Comp. Examples 1 to 10

Table 1 below shows the results of plurality of experiments were carried out for measuring solubility of the thinner compositions prepared according to Examples 1 to 5 (Ex. 1 to Ex. 5) and according to Comparative Examples 1 to 10 (Com. Ex. 1 to Com. Ex. 10). A degree of dissolving of the photoresist layer in the thinner composition was measured in a mixture in which the thinner composition and the photoresist are combined at a ratio of 1:1 or 10:1.

TABLE 1

|  | PR 1 | PR 2 | PR 3 | PR 4 | PR 5 | PR 6 | PR 7 | PR 8 |
|---|---|---|---|---|---|---|---|---|
| Ex 1 | ○ | ○ | ○ | ○ | ○ | ○ | ○ | ○ |
| Ex 2 | ○ | ○ | ○ | ○ | ○ | ○ | ○ | ○ |
| Ex 3 | ○ | ○ | ○ | ○ | ○ | ○ | ○ | ○ |
| Ex 4 | ○ | ○ | ○ | ○ | ○ | ○ | ○ | ○ |
| Ex 5 | ○ | Δ | ○ | ○ | ○ | ○ | ○ | ○ |
| Com. Ex 1 | ○ | ○ | ○ | ○ | ○ | ○ | ○ | ○ |
| Com. Ex 2 | ○ | ○ | ○ | ○ | ○ | ○ | ○ | ○ |
| Com. Ex 3 | ○ | ○ | ○ | ○ | ○ | ○ | ○ | ○ |
| Com. Ex 4 | ○ | ○ | ○ | ○ | ○ | ○ | ○ | ○ |
| Com. Ex 5 | ○ | ○ | ○ | ○ | ○ | ○ | ○ | ○ |
| Com. Ex 6 | ○ | X | ○ | ○ | ○ | ○ | ○ | ○ |
| Com. Ex 7 | ○ | Δ | ○ | ○ | ○ | ○ | ○ | ○ |
| Com. Ex 8 | X | X | ○ | ○ | ○ | ○ | ○ | ○ |
| Com. Ex 9 | X | X | ○ | ○ | ○ | ○ | ○ | ○ |
| Com. Ex 10 | ○ | ○ | ○ | ○ | ○ | ○ | ○ | ○ |

In the Table 1, PR1 through PR8 denote the same photoresists of previously described Experiments 1 through 8, respectively. Also, the symbol ○ represents that the photoresist is well dissolved into the thinner composition, the symbol Δ represents that some portion of the photoresist is precipitated after a predetermined time, and the symbol × represents that most of the photoresist is precipitated as soon as the photoresist was mixed in the thinner composition.

From Table 1 it can be seen that the thinner compositions according to Examples 1 to 5 favorably dissolve photoresists coated on a substrate, and the thinner compositions according to Comparative Examples 6 to 9 exhibitit poor dissolving of certain photoresists. Therefore, the thinner compositions according to The thinner compositions according to Comparative Examples 1 to 5 and Comparative example 10 also favorably dissolve the photoresists.

The thinner compositions according to the present invention are suitable for stripping a variety of photoresists.

EBR Experiments—Examples 1 to 5 & Comp. Examples 1 to 10

A plurality of experiments were carried out for measuring how much photoresist was stripped from the substrate when the EBR process was completed using the thinner compositions prepared according to Examples 1 to 5 and Comparative Examples 1 to 10. During the experiments, the thinner compositions were brought into contact with the photoresists in such a way that the thinner compositions were sprayed onto the substrate using a nitrogen (N$_2$)-pressurized coater, made by DNS Company, Japan. A pressure of the nitrogen (N$_2$) was 0.7 kg/cm$^2$, and the thinner composition was supplied at a flow rate of 13 cc/min. Results of the experiments are shown in Table 2.

TABLE 2

|  | PR 1 | PR 2 | PR 3 | PR 4 | PR 5 | PR 6 | PR 7 | PR 8 |
|---|---|---|---|---|---|---|---|---|
| Ex 1 | ○ | ○ | ○ | ○ | ○ | ○ | ○ | ○ |
| Ex 2 | ○ | ○ | ○ | ○ | ○ | ○ | ○ | ○ |
| Ex 3 | Δ | Δ | ○ | ○ | ○ | ○ | ○ | ○ |
| Ex 4 | Δ | Δ | ○ | ○ | ○ | ○ | ○ | ○ |
| Ex 5 | Δ | Δ | ○ | ○ | ○ | ○ | ○ | ○ |
| Com. Ex 1 | Δ | X | ○ | — | ○ | ○ | ○ | Δ |
| Com. Ex 2 | X | X | — | — | — | Δ | ○ | — |
| Com. Ex 3 | X | Δ | ○ | ○ | Δ | ○ | ○ | ○ |
| Com. Ex 4 | Δ | Δ | ○ | ○ | ○ | ○ | X | Δ |
| Com. Ex 5 | X | Δ | X | X | Δ | X | Δ | ○ |
| Com. Ex 6 | Δ | Δ | Δ | Δ | Δ | ○ | Δ | — |
| Com. Ex 7 | X | Δ | ○ | ○ | ○ | ○ | ○ | ○ |
| Com. Ex 8 | X | X | X | X | X | X | X | X |
| Com. Ex 9 | Δ | Δ | — | — | — | ○ | Δ | — |
| Com. Ex 10 | Δ | — | — | — | — | ○ | X | — |

In the Table 2, PR1 through PR8 denote the same photoresists of previously described Experiments 1 through 8, respectively. Also, the symbol ○ represents that no photoresist residues were present on the substrate and an edge profile, and a photoresist boundary line between the EBR process portion and the non-EBR process portion was clean after completing the EBR process; the symbol Δ represents that no residues were present on the substrate, but the edge profile was in a poor state; and the symbol × represents that there was residue present on the substrate and the edge profile was in a poor state. The symbol - means that no evaluation was made.

Table 2 indicates that the thinner compositions according to Examples 1 to 5 favorably strip off photoresists from the substrate in the EBR process.

When the EBR process was carried out using the thinner compositions according to Comparative Examples 1 to 5, the edge profile of the photoresist layer was curved, or photoresist residues remained on a portion of the substrate on which the EBR process was performed.

When the EBR process was carried out using the thinner compositions according to Comparative Example 6, the edge profile of the photoresist layer was somewhat curved when the I-line and G-line photoresist were used.

When the EBR process was carried out using the thinner compositions according to Comparative Example 7, the edge profile of the photoresist layer was curved and enlarged when the G-line photoresist was used.

When the EBR process was carried out using the thinner compositions according to Comparative Example 8, photoresist residues remained since the GBL was not able to complement the NBA characteristic that has strong penetration to the photoresist layer.

When the EBR process was carried out by using the thinner compositions according to Comparative Example 9, the edge profile of the photoresist was not clear and photoresist residues substantially remained when the I-line and G-line photoresists were used.

When the EBR process was carried out using the thinner compositions according to Comparative Example 10, the edge profile of the photoresist was not clear and photoresist residues substantially remained when the I-line and DUV photoresists were used.

Accordingly, the thinner compositions of the present invention exhibit favorable photoresist stripping characteristic during the EBR and the Rework processes. Nonetheless, the thinner compositions are relatively inexpensive, primarily due to the presence of PGMEA as a major component, and as mentioned previously, the compositions are environmentally friendly. Furthermore, it has been confirmed that the thinner compositions of the present invention do not adversely effect an underlying layer.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A thinner composition for stripping a photoresist, comprising propylene glycol mono-methyl ether acetate (PGMEA), ethyl 3-ethoxy propionate (EEP), and γ-butyrolactone (GBL).

2. The thinner composition of claim 1, wherein, based on the total weight of the thinner composition, an amount of the PGMEA is in a range of about 50% to about 80% by weight, an amount of the EEP is in a range of about 10% to 45% by weight, and an amount of the GBL is in a range of about 1% to 12% by weight.

3. The thinner composition of claim 1, wherein, based on the total weight of the thinner composition, an amount of the PGMEA is in a range of about 53% to 75% by weight, an amount of the EEP is in a range of about 12% to 30% by weight, and an amount of the GBL is in a range of about 2% to 10% by weight.

4. The thinner composition of claim 1, further comprising a surfactant.

5. A thinner composition for stripping a photoresist, comprising propylene glycol mono-methyl ether acetate (PGMEA), ethyl (3-ethoxy) propionate (EEP), and propylene glycol mono-methyl ether (PGME).

6. The thinner composition of claim 5, wherein, based on the total weight of the thinner composition, an amount of the PGMEA is in a range of about 40% to 80% by weight, an amount of the EEP is in a range of about 5% to 45% by weight, and an amount of the PGME is in a range of about 5% to 35% by weight.

7. The thinner composition of claim 5, wherein, based on the total weight of the thinner composition, an amount of the PGMEA is in a range of about 40% to 70% by weight, an amount of the EEP is in a range of about 10% to 40% by weight, and an amount of the PGME is in a range of about 10% to 30% by weight.

8. The thinner composition of claim 5, further comprising a surfactant.

9. A method of stripping a photoresist, comprising:
providing a thinner composition which includes propylene glycol mono-methyl ether acetate (PGMEA), ethyl 3-ethoxy propionate (EEP), and at least one of γ-butyrolactone (GBL) and propylene glycol mono-methyl ether (PGME);
stripping a photoresist coated on at least one of a backside and an edge portion of a substrate by bringing the thinner composition into contact with the photoresist; and
drying the thinner composition that is brought into contact on the photoresist.

10. The method of stripping a photoresist of claim 9, wherein, based on the total weight of the thinner composition, an amount of the PGMEA is in a range of about 50% to about 80% by weight, an amount of the EEP is in a range of about 10% to 45% by weight, and an amount of the GBL is in a range of about 1% to 12% by weight.

11. The method of stripping a photoresist of claim 9, wherein, based on the total weight of the thinner composition, an amount of the PGMEA is in a range of about 53% to 75% by weight, an amount of the EEP is in a range of about 12% to 30% by weight, and an amount of the GBL is in a range of about 2% to 10% by weight.

12. The method of stripping a photoresist of claim 9, wherein, based on the total weight of the thinner composition, an amount of the PGMEA is in a range of about 40% to 80% by weight, an amount of the EEP is in a range of about 5% to 45% by weight, and an amount of the PGME is in a range of about 5% to 35% by weight.

13. The method of stripping a photoresist of claim 9, wherein, based on the total weight of the thinner composition, an amount of the PGMEA is in a range of about 40% to 70% by weight, an amount of the EEP is in a range of about 10% to 40% by weight, and an amount of the PGME is in a range of about 10% to 30% by weight.

14. A method of stripping a photoresist, comprising:
providing a thinner composition which includes propylene glycol mono-methyl ether acetate (PGMEA), ethyl 3-ethoxy propionate (EEP), and at least one of γ-butyrolactone (GBL) and propylene glycol mono-methyl ether (PGME);
spraying the thinner composition onto a substrate coated with a photoresist while the substrate is rotated at a first speed; and
drying the thinner composition that is brought into contact on the substrate.

15. The method of stripping a photoresist of claim 14, further comprising temporarily stopping the rotating substrate, and spraying the thinner composition onto the substrate while the substrate is rotated at a second speed after completing spraying the thinner composition onto a substrate coated with a photoresist while the substrate is rotated at a first speed.

16. The method of stripping a photoresist of claim 15, wherein the first speed is lower than the second speed.

17. The method of stripping a photoresist of claim 14, further comprising rinsing the substrate with pure water after completing drying of the thinner composition that is brought into contact on the substrate.

18. The method of stripping a photoresist of claim 14, wherein, based on the total weight of the thinner composition, an amount of the PGMEA is in a range of about 50% to about 80% by weight, an amount of the EEP is in a range of about 10% to 45% by weight, and an amount of the GBL is in a range of about 1% to 12% by weight.

19. The method of stripping a photoresist of claim 14, wherein, based on the total weight of the thinner composition, an amount of the PGMEA is in a range of about 53% to 75% by weight, an amount of the EEP is in a range of about 12% to 30% by weight, and an amount of the GBL is in a range of about 2% to 10% by weight.

20. The method of stripping a photoresist of claim 14, wherein, based on the total weight of the thinner composition, an amount of the PGMEA is in a range of about 40% to 80% by weight, an amount of the EEP is in a range of about 5% to 45% by weight, and an amount of the PGME is in a range of about 5% to 35% by weight.

21. The method of stripping a photoresist of claim 14, wherein, based on the total weight of the thinner composition, an amount of the PGMEA is in a range of about 40% to 70% by weight, an amount of the EEP is in a range of about 10% to 40% by weight, and an amount of the PGME is in a range of about 10% to 30% by weight.

* * * * *